United States Patent
Bai et al.

(10) Patent No.: US 10,403,756 B2
(45) Date of Patent: Sep. 3, 2019

(54) THIN-FILM TRANSISTOR (TFT) AND MANUFACTURING METHOD THEREOF, ARRAY SUBSTRATE AND MANUFACTURING METHOD THEREOF, AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Jinchao Bai, Beijing (CN); Huibin Guo, Beijing (CN); Young Tae Hong, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/558,104

(22) PCT Filed: Feb. 24, 2017

(86) PCT No.: PCT/CN2017/074772
§ 371 (c)(1),
(2) Date: Sep. 13, 2017

(87) PCT Pub. No.: WO2017/193667
PCT Pub. Date: Nov. 16, 2017

(65) Prior Publication Data
US 2018/0358473 A1    Dec. 13, 2018

(30) Foreign Application Priority Data

May 11, 2016    (CN) .......................... 2016 1 0311349

(51) Int. Cl.
*H01L 27/12*    (2006.01)
*H01L 29/786*    (2006.01)
(Continued)

(52) U.S. Cl.
CPC ........ *H01L 29/78618* (2013.01); *H01L 27/12* (2013.01); *H01L 27/1229* (2013.01);
(Continued)

(58) Field of Classification Search
CPC ................................................. H01L 29/78618
See application file for complete search history.

(56) References Cited

U.S. PATENT DOCUMENTS

| 8,440,483 B2 | 5/2013 | Choi |
| 2005/0064675 A1 | 3/2005 | Kim |

(Continued)

FOREIGN PATENT DOCUMENTS

| CN | 102468232 A | 5/2012 |
| CN | 102544070 A | 7/2012 |

(Continued)

OTHER PUBLICATIONS

The First Chinese Office Action dated Jun. 26, 2016; Appln. No. 201610311349.6.

(Continued)

*Primary Examiner* — Fernando L Toledo
*Assistant Examiner* — Valerie N Newton
(74) *Attorney, Agent, or Firm* — Ladas & Parry LLP

(57) ABSTRACT

Embodiments of the present invention relate to a thin-film transistor (TFT) and a manufacturing method thereof, an array substrate and a manufacturing method thereof, and a display device. The TFT includes an active layer, an amorphous silicon (a-Si) connecting layer and a source-drain electrode layer. The active layer includes a channel region, a source region and a drain region; forming materials of the (Continued)

channel region include polycrystalline silicon (poly-Si); the a-Si connecting layer is disposed on a side of the active layer and includes a first connecting part and a second connecting part which are spaced from each other; the source-drain electrode layer includes a source electrode and a drain electrode which are spaced to each other; the source electrode is electrically connected with the source region through the first connecting part; and the drain electrode is electrically connected with the drain electrode through the second connecting part.

17 Claims, 3 Drawing Sheets

(51) Int. Cl.
    *H01L 29/66*     (2006.01)
    *H01L 21/77*     (2017.01)
    *H01L 29/08*     (2006.01)
    *H01L 29/10*     (2006.01)

(52) U.S. Cl.
    CPC .... *H01L 27/1288* (2013.01); *H01L 29/66765* (2013.01); *H01L 29/786* (2013.01); *H01L 29/78678* (2013.01); *H01L 21/77* (2013.01); *H01L 29/08* (2013.01); *H01L 29/10* (2013.01)

(56) References Cited

U.S. PATENT DOCUMENTS

| | | | |
|---|---|---|---|
| 2011/0033992 A1 | 2/2011 | Jung | |
| 2012/0107983 A1* | 5/2012 | Choi | H01L 21/77 |
| | | | 438/34 |
| 2012/0146042 A1 | 6/2012 | Kim et al. | |
| 2015/0294996 A1 | 10/2015 | Li et al. | |
| 2016/0315158 A1 | 10/2016 | Jiang et al. | |

FOREIGN PATENT DOCUMENTS

| | | |
|---|---|---|
| CN | 103456739 A | 12/2013 |
| CN | 104779301 A | 7/2015 |
| CN | 105870198 A | 8/2016 |
| CN | 205582944 U | 9/2016 |
| JP | 63299276 A | 12/1988 |

OTHER PUBLICATIONS

International Search Report and Written Opinion dated Jun. 9, 2017: PCT/CN2017/074772.

The Second Chinese Office Action dated Dec. 10, 2018; Appln. No. 201610311349.6.

* cited by examiner

THIN-FILM TRANSISTOR (TFT) AND MANUFACTURING METHOD THEREOF, ARRAY SUBSTRATE AND MANUFACTURING METHOD THEREOF, AND DISPLAY DEVICE

TECHNICAL FIELD

Embodiments of the present invention relate to a thin-film transistor (TFT) and a manufacturing method thereof, an array substrate and a manufacturing method thereof, and a display device.

BACKGROUND

Polycrystalline silicon (poly-Si) TFTs have been widely applied in display devices due to the advantages of high electron mobility and stability.

However, processing steps of the poly-Si TFT are numerous, and about 10 exposure processes are required. Taking a low-temperature polycrystalline silicon (LTPS) TFT as an example, manufacturing process of the LTPS TFT includes: laser annealing process for forming poly-Si, two ion implantation processes for forming an active layer including a lightly doped region, a heavily doped region and a channel region, and high-temperature processes such as dehydrogenation, hydrogenation and activation. Due to the complex processes, the LTPS TFT usually is developed and mass-produced on 6th generation line or below and has the defects of low yield, high equipment investment, and poor compatibility with the production line of amorphous silicon (a-Si) TFTs.

SUMMARY

At least one embodiment of the present disclosure provides a thin-film transistor (TFT) and a manufacturing method thereof, an array substrate and a manufacturing method thereof, and a display device, which can simplify the manufacturing process of a poly-Si TFT.

At least one embodiment of the present disclosure provides a thin-film transistor (TFT), comprising: an active layer, including a channel region, a source region and a drain region, in which forming materials of the channel region include polycrystalline silicon (poly-Si); an amorphous silicon (a-Si) connecting layer, disposed on a side of the active layer and including a first connecting part and a second connecting part which are disposed to be spaced from each other; and a source-drain electrode layer, including a source electrode and a drain electrode which are disposed to be spaced from each other, in which the source electrode is electrically connected with the source region through the first connecting part, and the drain electrode is electrically connected with the drain region through the second connecting part.

For example, both the source region and the drain region are non-doped regions.

For example, forming materials of the source region and the drain region are non-doped a-Si or non-doped poly-Si.

For example, the a-Si connecting layer includes a first a-Si layer and a second a-Si layer which are laminated to each other, the second a-Si layer is disposed between the first a-Si layer and the source-drain electrode layer, and the electrical conductivity of the second a-Si layer is greater than that of the first a-Si layer.

For example, forming materials of the first a-Si layer are non-doped a-Si.

For example, the TFT further comprises a support substrate, wherein the active layer is disposed between the support substrate and the source-drain electrode layer in a direction perpendicular to the support substrate.

For example, materials of the source-drain electrode layer are metallic materials.

For example, a distance between outer edges of the active layer is substantially equal to a distance between an outer edge of the first connecting part and an outer edge of the second connecting part in a direction from the source region to the drain region.

For example, a distance between an outer edge of the source electrode and an outer edge of the drain electrode is substantially equal to the distance between the outer edge of the first connecting part and the outer edge of the second connecting part.

For example, a distance between an outer edge of the source electrode and an outer edge of the drain electrode is equal to a distance between an outer edge of the first connecting part and an outer edge of the second connecting part.

For example, the TFT further comprises a support substrate and a gate electrode, wherein the gate electrode is disposed between the active layer and the support substrate.

At least one embodiment of the present disclosure provides an array substrate, comprising a plurality of TFTs as mentioned above, wherein the plurality of TFTs are disposed to be spaced to each other.

For example, the array substrate further comprises a plurality of pixel electrodes which are disposed to be spaced to each other, wherein the plurality of pixel electrodes respectively correspond to the plurality of TFTs, and each of the plurality of pixel electrode is electrically connected with a drain electrode of corresponding one of the plurality of TFTs.

At least one embodiment of the present disclosure provides a display device, comprising the array substrate as mentioned above.

At least one embodiment of the present disclosure provides a method for manufacturing a TFT, comprising: forming an active layer including a channel region, a source region and a drain region, in which forming materials of the channel region include poly-Si; forming an a-Si connecting layer on a side of the active layer, in which the a-Si connecting layer includes a first connecting part and a second connecting part which are disposed to be spaced from each other; and forming a source-drain electrode layer on a side of the a-Si connecting layer away from the active layer, in which the source-drain electrode layer includes a source electrode and a drain electrode, the source electrode is electrically connected with the source region through the first connecting part, and the drain electrode is electrically connected with the drain region through the second connecting part.

For example, the forming the a-Si connecting layer includes: forming a first a-Si layer and a second a-Si layer which are laminated to each other, in which the second a-Si layer is formed between the first a-Si layer and the source-drain electrode layer, and an electrical conductivity of the second a-Si layer is greater than that of the first a-Si layer.

For example, the forming the active layer includes: forming an a-Si film; and performing a laser annealing treatment on a region to be formed as the channel region of the a-Si film, or a region to be formed as the channel region, the source region and the drain region of the a-Si film, so as to form poly-Si in the region.

For example, the active layer and the a-Si connecting layer are formed by half-exposure process; or the active layer, the a-Si connecting layer and the source-drain electrode layer are formed by half-exposure layer.

For example, the manufacturing method further comprises: forming an a-Si connecting layer film and a source-drain electrode layer film which are laminated to each other; and forming the a-Si connecting layer and the source-drain electrode layer by performing one exposure process on the a-Si connecting layer film and the source-drain electrode layer film.

At least one embodiment of the present disclosure provides a method for manufacturing an array substrate, comprising: forming a plurality of TFTs which are disposed to be spaced to each other, wherein the TFTs are manufactured by the manufacturing method as mentioned above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

Figure 1:
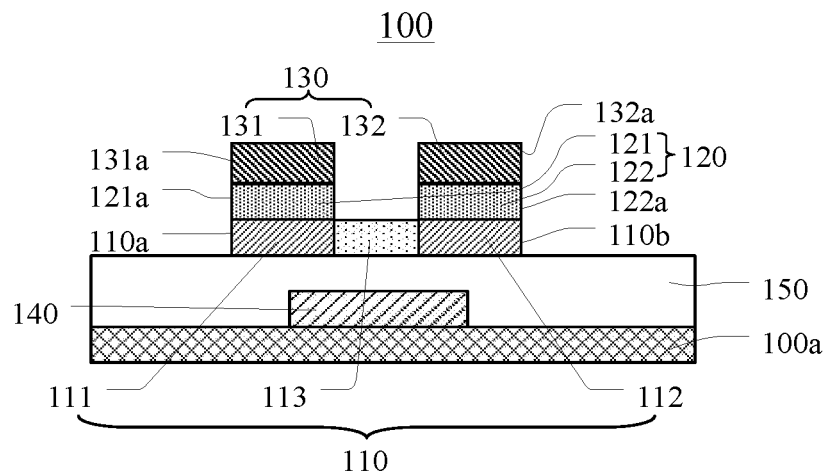
FIG. 1 is a schematic cross-sectional view of a TFT provided by an embodiment of the present invention.

Reference numerals of the accompanying drawings:

| | | |
|---|---|---|
| 10: array substrate | 100, 200: TFT | 101: pixel electrode |
| 102: insulating layer | 110, 210: active layer | 100a, 200a: support substrate |
| 130, 230: source-drain electrode layer | | 111, 211: source region |
| 112, 212: drain region | 113, 213: channel region | 120: a-Si connecting layer |
| 121: first connecting part | 122: second connecting part | |
| 130: source-drain electrode layer | | |
| 131: source electrode | 132: drain electrode | 140, 240: gate electrode |
| 150: gate insulating layer | 120a: first a-Si connecting layer | |
| 120b: second a-Si connecting layer | 110': a-Si film | |
| 120': a-Si connecting layer film | 130': source-drain electrode layer film | |

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," or the like are only used to indicate relative position relationship, and when the position of the object which is described is changed, the relative position relationship may be changed accordingly.

Embodiments of the present invention provide a TFT and a manufacturing method thereof, an array substrate and a manufacturing method thereof, and a display device. In the embodiments of the present invention, an active layer of the TFT includes a channel region formed by poly-Si materials, so that the TFT is guaranteed to have relatively large on-state current. In addition, a source region and a drain region of the active layer are respectively electrically connected with a source electrode and a drain electrode through an amorphous silicon material or both are made from a doped amorphous silicon material, so as to be electrically connected to the source electrode and the drain electrode. Thus, two ion implantation processes for forming a lightly doped region and a heavily doped region, and corresponding exposure processes can be saved. Therefore, the embodiments of the present invention can simplify the manufacturing process of the poly-Si TFT on the premise of ensuring that the poly-Si TFT has relatively large on-state current.

Detailed description will be given below to the TFT and the manufacturing method thereof, the array substrate and the manufacturing method thereof, and the display device,

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

provided by the embodiments of the present invention, with reference to the accompanying drawings.

As illustrated in FIG. 1, at least one embodiment of the present invention provides a TFT 100. The TFT 100 comprises an active layer 110, an amorphous silicon (a-Si) connecting layer 120 and a source-drain electrode layer 130. The active layer 110 includes a channel region 113, and a source region 111 and a drain region 112 which are respectively disposed on both sides of the channel region 113 and connected with the channel region 113. Forming materials of the channel region 113 include poly-Si. For instance, forming materials of the source region 111 and the drain region 112 may be poly-Si or a-Si; the a-Si connecting layer 120 is disposed on a side of the active layer 110 and includes a first connecting part 121 and a second connecting part 122 which are disposed to be spaced from each other; the source-drain electrode layer 130 includes a source electrode 131 and a drain electrode 132 which are disposed to be spaced from each other; the source electrode 131 is electrically connected with the source region 111 through the first connecting part 121; and the drain electrode 132 is electrically connected with the drain region 112 through the second connecting part 122.

In the TFT 100 provided by the embodiments of the present invention, the source region 111 and the drain region 112 of the active layer 110 are respectively electrically connected with the source electrode 131 and the drain electrode 132 through the a-Si connecting layer 120. Therefore, compared with manufacturing process of the poly-Si TFT known by an inventor (inventors), the manufacturing process of the TFT 100 provided by the embodiments of the present invention can omit the ion implantation processes for forming a lightly doped region and a heavily doped region, and corresponding exposure processes, and has the advantages of simple manufacturing process of the TFT 100, low equipment investment, applicability for high-generation lines, and good compatibility with the production line of a-Si TFTs. On the other hand, compared with the a-Si TFT known by an inventor (inventors), the channel region 113 of the active layer 110 in the TFT 100 provided by the embodiment of the present invention is made from poly-Si materials (for instance, LTPS materials), and as the poly-Si materials have high electron mobility, the TFT 100 provided by the embodiment of the present invention has relatively large on-state current.

For instance, both the source region 111 and the drain region 112 of the active layer 110 may be non-doped regions. For instance, forming materials of the source region 111 and the drain region 112 may both be non-doped a-Si or non-doped poly-Si. The source region 111 and the drain region 112 are respectively electrically connected with the source electrode 131 and the drain electrode 132 through the a-Si connecting layer 120, and both are non-doped regions. Thus, the TFT 100 provided by the embodiment of the present invention has relatively low OFF-state leakage current. When both the source region 111 and the drain region 112 are non-doped a-Si, compared with the poly-Si TFT including lightly and heavily doped regions known by an inventor (inventors), the TFT 100 provided by the embodiment of the present invention has relatively lower OFF-state leakage current.

In order to connect the source region 111 with the source electrode 131 and connect the drain region 112 and the drain electrode 132, for instance, when the forming materials of the source region 111 and the drain region 112 are both non-doped a-Si or non-doped poly-Si, the forming materials of the first connecting part 121 and the second connecting part 122 of the a-Si connecting layer 120 may be doped a-Si, e.g., P-doped a-Si or N-doped a-Si.

For instance, in order to improve the electrical connection between the source region 111 and the source electrode 131, and between the drain region 112 and the drain electrode 132, materials of the source-drain electrode layer 130 may be metallic materials.

For instance, as shown in FIG. 1, the TFT 100 provided by at least one embodiment of the present invention further comprises a support substrate 100a. Moreover, the active layer 110 may be disposed between the support substrate 100a and the source-drain electrode layer 130 in a direction perpendicular to the support substrate 100a. Thus, the manufacturing process of the TFT 100 can be simpler.

The poly-Si TFT known by an inventor (inventors) is a top-gate structure, so the active layer may be subjected to ion implantation doping by taking a gate electrode as a mask in the manufacturing process. As the manufacturing process of the TFT 100 provided by the embodiment of the present invention can omit the ion implantation doping process, for instance, the TFT 100 provided by at least one embodiment of the present invention may be a bottom-gate structure. That is to say, the TFT 100 further comprises a gate electrode 140; a gate insulating layer 150 is disposed between the gate electrode 140 and the active layer 110; and the gate electrode 140 is disposed between the active layer 110 and the support substrate 100a. Of course, in some embodiments, the TFT 100 may also adopt a top-gate structure.

In at least one embodiment of the present invention, in order to simplify the manufacturing process of the TFT 100, a plurality of thin films in the TFT 100 may be prepared by the same one exposure process.

For instance, in a direction from the source region 111 to the drain region 112, a distance between outer edges 110a and 110b of the active layer 110 may be substantially equal to a distance between outer edge 121a of the first connecting part 121 and outer edge 122a of the second connecting part 122. Thus, the active layer 110 and the a-Si connecting layer 120 may be formed by one exposure process (for instance, half-exposure process), so the number of the exposure processes can be reduced. On this basis, for instance, a distance between outer edge 131a of the source electrode 131 and outer edge 132a of the drain electrode 132 may be substantially equal to the distance the outer edge 121a of the first connecting part 121 and the outer edge 122a of the second connecting part 122. Thus, the source-drain electrode layer 130, the active layer 110 and the a-Si connecting layer 120 may be formed by one exposure process (for instance, half-exposure process), so the number of the exposure processes can be further reduced.

For instance, the distance between the outer edge 131a of the source electrode 131 and the outer edge 132a of the drain electrode 132 may be substantially equal to the distance the outer edge 121a of the first connecting part 121 and the outer edge 122a of the second connecting part 122. Thus, the source-drain electrode layer 130 and the a-Si connecting layer 120 may be formed by one exposure process (for instance, half-exposure process), so as to reduce the number of the exposure processes.

Description is given in FIG. 1 by taking a case that the a-Si connecting layer 120 is a single-layer structure as an example. Of course, the a-Si connecting layer 120 may also be a multi-layer structure.

Figure 2:
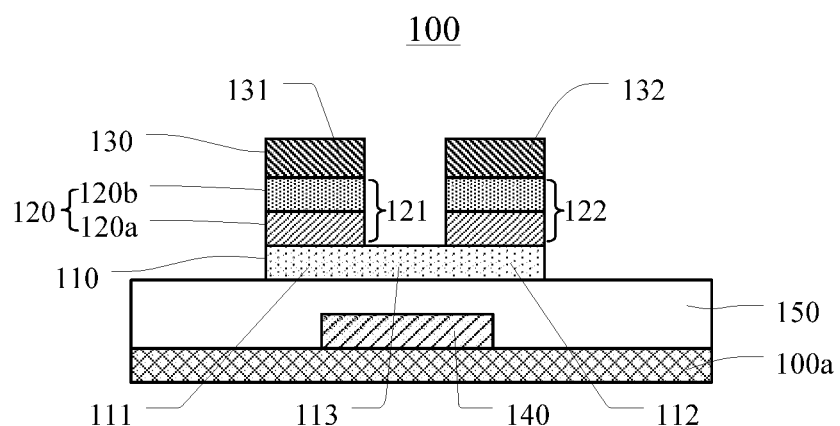
FIG. 2 is a schematic cross-sectional view of another TFT provided by an embodiment of the present invention.

For instance, as shown in FIG. 2, in the TFT 100 provided by at least one embodiment of the present invention, the a-Si connecting layer 120 includes a first a-Si layer 120a and a second a-Si layer 120b which are laminated to each other; the second a-Si layer 120b is disposed between the first a-Si layer 120a and the source-drain electrode layer 130; and the electrical conductivity of the second a-Si layer 120b is greater than that of the first a-Si layer 120a. In this case, the second a-Si layer 120b may have the function of an ohmic contact layer, so as to improve the electrical connection between the first a-Si connecting layer 120a and the source-drain electrode layer 130.

For instance, the second a-Si layer 120b may be N-doped a-Si or P-doped a-Si.

For instance, the first a-Si layer may be non-doped a-Si. As the a-Si connecting layer 120 includes the first a-Si layer 120a made from the non-doped a-Si, the OFF-state leakage current of the TFT 100 can be advantageously reduced.

For instance, in the embodiment as shown in FIG. 2, the forming materials of the source region 111 and the drain region 112 may both be non-doped poly-Si. Compared with the poly-Si TFT including the lightly and heavily doped regions known by an inventor (inventors), the TFT 100 can have relatively low OFF-state leakage current.

Figure 3:
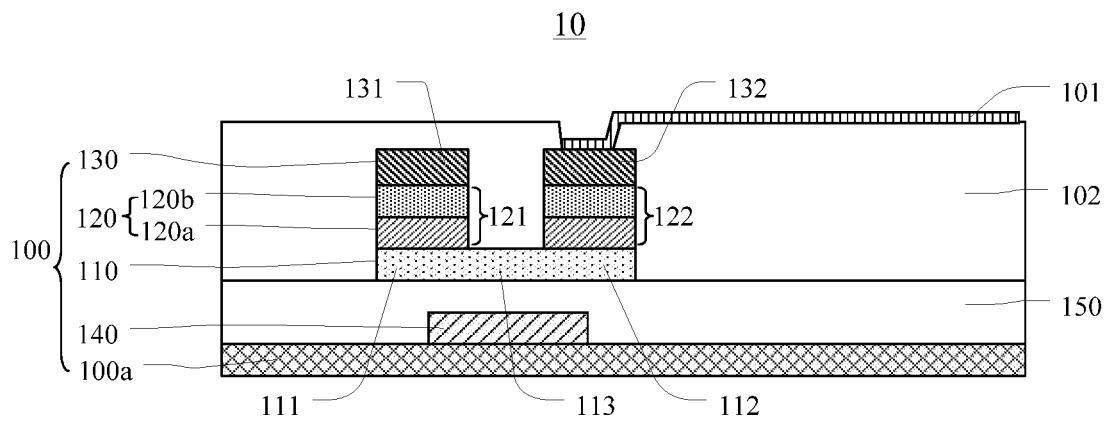
FIG. 3 is a schematic cross-sectional view of an array substrate provided by an embodiment of the present invention.

As illustrated in FIG. 3, at least one embodiment of the present invention further provides an array substrate 10, which comprises a plurality of TFTs 100 provided by any foregoing embodiment and disposed to be spaced to each other. FIG. 3 only shows one TFT 100, and the a-Si connecting layer 120 in the TFT 100 is a two-layer structure. Of course, the array substrate provided by the embodiment of the present invention includes but not limited to the embodiment as shown in FIG. 3.

For instance, the array substrate 10 provided by at least one embodiment of the present invention may further comprise a plurality of pixel electrodes 101 disposed to be spaced to each other; the plurality of pixel electrodes 101 respectively correspond to the plurality of TFTs 100, and each pixel electrode 101 is electrically connected with a drain electrode 132 of corresponding TFT 100. For instance, the array substrate 10 may further comprise an insulating layer 102 covering the TFTs 100, the pixel electrode 101 may be electrically connected with the drain electrode 132 of the corresponding TFT 100 via a through hole in the insulating layer 102.

For instance, the pixel electrode 101 may be made from indium tin oxide (ITO), indium zinc oxide (IZO) or similar transparent conductive materials. No limitation will be given here.

The array substrate provided by the embodiment of the present invention may be an organic light-emitting diode (OLED) array substrate and may also be an array substrate applied to a liquid crystal display (LCD) device. In addition, the array substrate 10 may further comprise structures such as common electrode lines, gate lines and data lines. No further description will be given here.

At least one embodiment of the present invention further provides a display device, which comprises the array substrate 10 provided by any foregoing embodiment.

For instance, the display device may be: any product or component with display function such as an LCD panel, e-paper, an OLED panel, a mobile phone, a tablet PC, a TV, a display, a notebook computer, a digital picture frame and a navigator.

Figure 4:
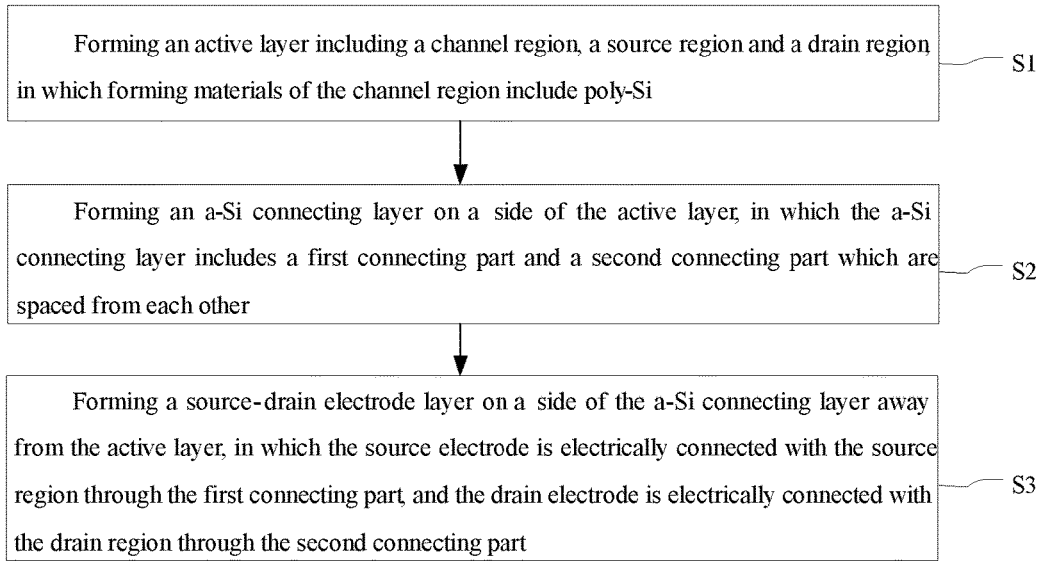
FIG. 4 is a flow diagram of a method for manufacturing a TFT, provided by an embodiment of the present invention.

As illustrated in FIG. 4, at least one embodiment of the present invention further provides a method for manufacturing a TFT, which comprises: S1: forming an active layer including a channel region, a source region and a drain region, in which forming materials of the channel region include poly-Si; S2: forming an a-Si connecting layer 120 on one side of the active layer, in which the a-Si connecting layer includes a first connecting part and a second connecting part which are disposed to be spaced from each other; and S3: forming a source-drain electrode layer on a side of the a-Si connecting layer away from the active layer, in which the source-drain electrode layer includes a source electrode and a drain electrode, the source electrode is electrically connected with the source region through the first connecting part, and the drain electrode is electrically connected with the drain region through the second connecting part.

For instance, in the step S1, forming the active layer may include: forming an a-Si film; and performing laser annealing treatment on a region to be formed as the channel region of the a-Si film, or a region to be formed as the channel region, a source region and a drain region of the a-Si film, so that in the region, the poly-Si may be formed. In the embodiment of the present invention, the poly-Si is formed by performing local laser annealing treatment on the a-Si film and compared with a manner performing laser annealing treatment on the entire a-Si film known by an inventor (inventors), the manufacturing method provided by the embodiment of the present invention can be applied to high-generation production lines.

The orders of the steps S1 to S3 in the manufacturing method provided by the embodiment of the present invention are not limited.

For instance, the active layer and the a-Si connecting layer may be formed by half-exposure process, namely the steps S1 and S2 may be performed simultaneously; or, the active layer, the a-Si connecting layer and the source-drain electrode layer may be formed by half-exposure process, namely the steps S1 to S3 may be performed simultaneously. The half-exposure process refers to a process for performing exposure treatment on a photoresist on a film via a half-tone mask or a gray-tone mask, and subsequently, forming required patterns by development and etching.

For instance, an a-Si connecting layer film (namely a film to be formed as the a-Si connecting layer) and a source-drain electrode layer film (namely a film for forming the source-drain electrode layer) which are laminated to each other may be formed; and subsequently, the a-Si connecting layer and the source-drain electrode layer are formed by performing one exposure process on the a-Si connecting layer film and the source-drain electrode layer film. That is to say, the steps S2 and S3 may be simultaneously performed.

Of course, the order of the steps S1 to S3 include but not limited to these enumerative orders.

The method provided by the embodiment of the present invention may be used for manufacturing the TFT 100 provided by any foregoing embodiment.

For instance, as for the TFT 100 as shown in FIG. 2, in the manufacturing method provided by at least one embodiment of the present invention, forming the a-Si connecting layer 120 may include: forming a first a-Si layer 120a and a second a-Si layer 120b which are laminated to each other, in which the second a-Si layer 120b is formed between the first a-Si layer 120a and the source-drain electrode layer 130, and the electrical conductivity of the second a-Si layer 120b is greater than that of the first a-Si layer 120a. Thus, the electrical connection between the first a-Si connecting layer 120a and the source-drain electrode layer 130 can be improved.

For instance, the second a-Si layer 120b may be N-doped a-Si or P-doped a-Si. For instance, the first a-Si layer may be non-doped a-Si.

Detailed description will be given below to the manufacturing method provided by the embodiment of the present invention by taking the TFT 100 as shown in FIG. 2 as an example. For instance, as shown in FIGS. 5a to 5c, the method may comprise the following steps S01 to S04.

Figure 5A:
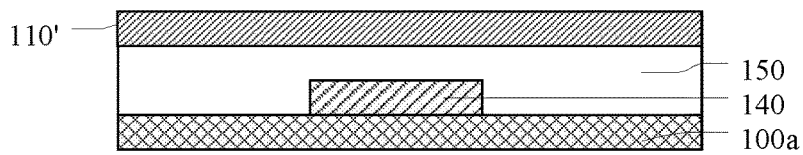
FIGS. 5*a*-5*c* are schematic cross-sectional views illustrating steps of manufacturing the TFT as shown in FIG. 2 in an embodiment of the present invention.

S01: as shown in FIG. 5a, forming a gate electrode 140, a gate insulating layer 150 and an a-Si film 110' on a support substrate 100a (e.g., a glass substrate) in sequence.

For instance, the gate electrode 140 is formed by processes such as deposition, exposure and etching; the gate insulating layer 150 is formed by deposited, for instance, a silicon nitride layer and a silicon dioxide layer; and then, the a-Si film 110' is deposited.

Figure 5B:
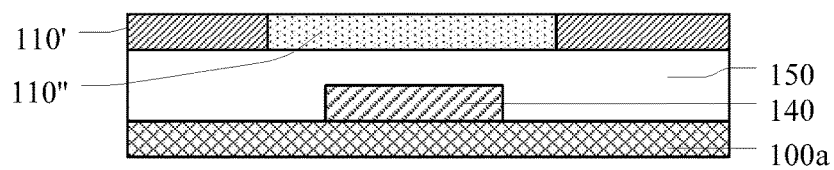
Figure 5C:
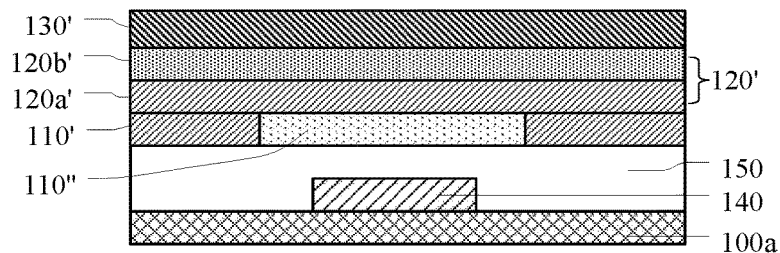

S02: as shown in FIG. 5b, performing high-temperature dehydrogenation on the support substrate 100a obtained after the step S01, and then performing laser annealing treatment on a portion 110" of the a-Si film 110' for forming the active layer (namely for forming the channel region 113, the source region 111 and the drain region 112), so that the portion 110" may be formed as poly-Si film.

S03: as shown in FIG. 5c, depositing an a-Si connecting layer film 120' and a source-drain electrode layer film 130' on the support substrate 100a obtained after the step S02 in sequence, in which the a-Si connecting layer film 120' includes a film 120a' (e.g., non-doped a-Si, hereafter referred to as a-Si) for forming the first a-Si layer and a film 120b' (for instance, doped a-Si, e.g., N-doped a-Si, hereafter referred to as n+a-Si) for forming the second a-Si layer which are deposited in sequence.

S04: performing half-exposure process on the support substrate 100a obtained after the step S03, and then performing etching to form the first a-Si layer 120a, the second a-Si layer 120b, the active layer 110 and the source-drain electrode layer 130 of the TFT 100 as shown in FIG. 2.

At least one embodiment of the present invention further provides a method for manufacturing an array substrate, which comprises: forming a plurality of TFTs disposed to be spaced to each other. The TFT is manufactured by using the manufacturing method provided by any foregoing embodiment. For instance, the TFT may be the TFT 100 provided by any foregoing embodiment.

Figure 6:
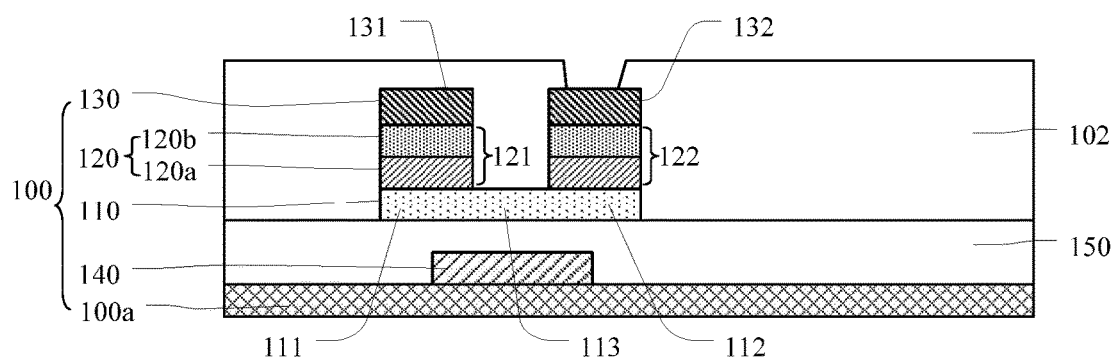
FIG. 6 is a schematic cross-sectional view of for manufacturing an insulating layer of an array substrate in an embodiment of the present invention.

For instance, after the TFT is manufactured, as shown in FIG. 6, the method provided by the embodiment of the present invention may further comprise: forming an insulating layer 102 for covering the TFT 100, and a through hole (not shown in FIG. 6) disposed in the insulating layer 102; and forming a pixel electrode 101, in which the pixel electrode 101 are electrically connected with a drain electrode 132 of the TFT 100 via the through hole in the insulating layer 102.

The manufacturing method provided by the embodiment of the present invention is applicable to various display modes such as twisted nematic (TN), vertical alignment (VA), in-plane switch (IPS) and advanced super dimension switch (ADS).

Of course, the manufacturing method provided by the embodiment of the present invention further comprises other steps. For instance, gate lines and common electrode lines may also be formed in a process of forming the gate electrode 140 of the TFT 100. For instance, data lines may also be formed in a process of forming the source electrode 131 and the drain electrode 132 of the TFT 100. For instance, common electrodes may also be formed and are electrically connected with the common electrode lines. No further description will be given here.

Figure 7:
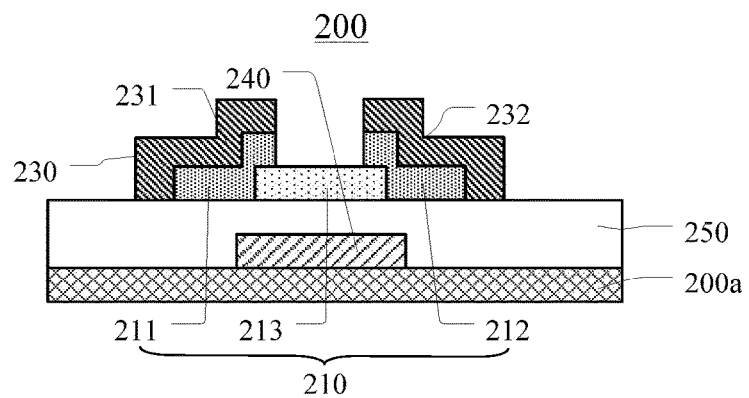
FIG. 7 is a schematic cross-sectional view of a TFT provided by an embodiment of the present invention.

As illustrated in FIG. 7, at least one embodiment of the present invention further provides a TFT 200, which comprises an active layer 210 and a source-drain electrode layer 230. The active layer 210 includes a channel region 213, and a source region 211 and a drain region 212 which are respectively disposed on both sides of the channel region 213 and connected with the channel region 213; forming materials of the channel region 213 include poly-Si; forming materials of the source region 211 and the drain region 212 include doped a-Si (e.g., N-doped a-Si or P-doped a-Si); the source-drain electrode layer 230 is disposed on a side of the active layer 210 and includes a source electrode 231 and a drain electrode 232 which are disposed to be spaced from each other; the source electrode 231 is electrically connected with the source region 211; and the drain electrode 232 is electrically connected with the drain region 212.

For instance, the manufacturing method of the active layer 210 may include: forming an a-Si film; performing a laser annealing treatment on a region to be formed as the channel region 213 of the a-Si film to form poly-Si, and then removing a remaining portion of the a-Si film by processes such as exposure and etching; forming a doped a-Si film on the poly-Si channel region (for instance, the doped a-Si film may be formed directly by deposition), and performing processes such as exposure and etching to the doped a-Si film to form the source region 211 and the drain region 212 connected with the channel region 213, thus, forming the active layer 210. Of course, the active layer 210 may also be formed by other means.

In the TFT 200 provided by the embodiment of the present invention, the source region 211 and the drain region 212 of the active layer 210 are made from doped a-Si materials, so as to be respectively electrically connected with the source electrode 131 and the drain electrode 132. Therefore, compared with the manufacturing process of the poly-Si TFT known by an inventor (inventors), the manufacturing process of the TFT 200 provided by the embodiment of the present invention can omit the ion implantation processes for forming the lightly and heavily doped regions, and corresponding exposure processes, so the manufacturing process of the TFT 200 has the advantages of simple processes, low equipment investment, applicability to high-generation lines, and good compatibility with the production line of the a-Si TFT. On the other hand, compared with the a-Si TFT known by an inventor (inventors), the channel region 213 of the active layer 210 in the TFT 200 provided by the embodiment of the present invention is made from poly-Si materials (for instance, LTPS materials), and as the poly-Si materials have relatively high electron mobility, the TFT 200 provided by the embodiment of the present invention has relatively large on-state current.

For instance, the TFT 200 further comprises a support substrate 200a. Moreover, in a direction perpendicular to the support substrate 200a, the channel region 213, the source region 211 and the source electrode 131 may be overlapped at the same position, and the channel region 213, the drain region 212 and the drain electrode 132 may also be overlapped at the same position. Thus, the electrical connection between the channel region, the source-drain regions and the source-drain electrodes can be improved.

Of course, the TFT 200 provided by the embodiment of the present invention may further comprise structures such as a support substrate 200a, a gate electrode 240, and a gate insulating layer 250 disposed between the gate electrode 240 and the active layer 210.

In summary, the TFT and the manufacturing method thereof, the array substrate and the manufacturing method thereof, and the display device, provided by the embodiments of the present invention, at least have one of the following advantages.

1. In the embodiments of the present invention, the source region and the drain region of the active layer can be respectively electrically connected with the source electrode and the drain electrode without ion implantation on the active layer of the TFT, so the ion implantation process and corresponding exposure processes can be omitted.

2. In the embodiments of the present invention, as the channel region of the active layer in the TFT is made from poly-Si (e.g., LTPS) materials, relatively high electron mobility can be guaranteed.

3. In some embodiments of the present invention, both the source region and the drain region of the active layer are non-doped regions and respectively connected with the source electrode and the drain electrode through the a-Si connecting layer, so the OFF-state leakage current can be reduced.

4. In the manufacturing method provided by the embodiments of the present invention, by performing a local laser annealing treatment on the a-Si film to be formed as the poly-Si, the annealing uniformity and the cycle time can be guaranteed, and the manufacturing method provided by the embodiments of the present invention is applicable to high-generation production lines.

5. Compared with the manufacturing process of the a-Si TFT, the manufacturing method provided by the embodiments of the present invention only adds high-temperature dehydrogenation and laser annealing treatment, and hence has the advantages of low equipment investment, simple processes, and good compatibility with the production line of the a-Si TFT.

The embodiments of the TFT and the manufacturing method thereof, the array substrate and the manufacturing method thereof, and the display device may refer to each other. In addition, the embodiments of the present invention and the characteristics in the embodiments may be mutually combined without conflict.

The application claims priority to the Chinese patent application No. 201610311349.6, filed May 11, 2016, the disclosure of which is incorporated herein by reference as part of the application.

The invention claimed is:

1. A thin-film transistor (TFT), comprising:
an active layer, including a channel region, a source region and a drain region, in which forming materials of the channel region include polycrystalline silicon (poly-Si);
an amorphous silicon (a-Si) connecting layer, disposed on a side of the active layer and including a first connecting part and a second connecting part which are disposed to be spaced from each other; and
a source-drain electrode layer, including a source electrode and a drain electrode which are disposed to be spaced from each other,
in which the source electrode is electrically connected with the source region through the first connecting part, and the drain electrode is electrically connected with the drain region through the second connecting part,
wherein in a direction from the source region to the drain region, a distance between outer edges of the active layer is equal to a distance between an outer edge of the first connecting part and an outer edge of the second connecting part, and is equal to a distance between an outer edge of the source electrode and an outer edge of the drain electrode.

2. The TFT according to claim 1, wherein both the source region and the drain region are non-doped regions.

3. The TFT according to claim 2, wherein forming materials of the source region and the drain region are non-doped a-Si or non-doped poly-Si.

4. The TFT according to claim 1, wherein the a-Si connecting layer includes a first a-Si layer and a second a-Si layer which are laminated to each other, the second a-Si layer is disposed between the first a-Si layer and the source-drain electrode layer, and an electrical conductivity of the second a-Si layer is greater than that of the first a-Si layer.

5. The TFT according to claim 4, wherein forming materials of the first a-Si layer are non-doped a-Si.

6. The TFT according to claim 1, further comprising a support substrate, wherein the active layer is disposed between the support substrate and the source-drain electrode layer in a direction perpendicular to the support substrate.

7. The TFT according to claim 1, wherein materials of the source-drain electrode layer are metallic materials.

8. The TFT according to claim 1, further comprising a support substrate and a gate electrode, wherein the gate electrode is disposed between the active layer and the support substrate.

9. An array substrate, comprising a plurality of TFTs according to claim 1, wherein the plurality of TFTs are disposed to be spaced to each other.

10. The array substrate according to claim 9, further comprising a plurality of pixel electrodes which are disposed to be spaced to each other, wherein the plurality of pixel electrodes respectively correspond to the plurality of TFTs, and each of the plurality of pixel electrode is electrically connected with a drain electrode of corresponding one of the plurality of TFTs.

11. A display device, comprising the array substrate according to claim 9.

12. A method for manufacturing a TFT, comprising:
forming an active layer including a channel region, a source region and a drain region, in which forming materials of the channel region include poly-Si;
forming an a-Si connecting layer on a side of the active layer, in which the a-Si connecting layer includes a first connecting part and a second connecting part which are disposed to be spaced from each other; and
forming a source-drain electrode layer on a side of the a-Si connecting layer away from the active layer, in which the source-drain electrode layer includes a source electrode and a drain electrode, the source electrode is electrically connected with the source region through the first connecting part, and the drain electrode is electrically connected with the drain region through the second connecting part,
wherein in a direction from the source region to the drain region, a distance between outer edges of the active layer is equal to a distance between an outer edge of the first connecting part and an outer edge of the second connecting part, and is equal to a distance between an outer edge of the source electrode and an outer edge of the drain electrode.

13. The manufacturing method according to claim 12, wherein forming the a-Si connecting layer includes: forming a first a-Si layer and a second a-Si layer which are laminated to each other, in which the second a-Si layer is formed between the first a-Si layer and the source-drain electrode layer, and an electrical conductivity of the second a-Si layer is greater than that of the first a-Si layer.

14. The manufacturing method according to claim 12, wherein the forming the active layer includes:
forming an a-Si film; and
performing a laser annealing treatment on a region to be formed as the channel region of the a-Si film, or a region to be formed as the channel region, the source region and the drain region of the a-Si film, so as to form poly-Si in the region.

15. The manufacturing method according to claim 1, wherein
the active layer and the a-Si connecting layer are formed by half-exposure process; or
the active layer, the a-Si connecting layer and the source-drain electrode layer are formed by half-exposure layer.

16. The manufacturing method according to claim 12, comprising:

forming an a-Si connecting layer film and a source-drain electrode layer film which are laminated to each other; and forming the a-Si connecting layer and the source-drain electrode layer by performing one exposure process on the a-Si connecting layer film and the source-drain electrode layer film.

17. A method for manufacturing an array substrate, comprising:

forming a plurality of TFTs which are disposed to be spaced to each other, wherein the TFTs are manufactured by the manufacturing method according to claim 12.

* * * * *